US010680001B2

(12) United States Patent
Taniguchi et al.

(10) Patent No.: US 10,680,001 B2
(45) Date of Patent: Jun. 9, 2020

(54) NON-VOLATILE SEMICONDUCTOR MEMORY DEVICE

(71) Applicant: Floadia Corporation, Kodaira-shi, Tokyo (JP)

(72) Inventors: Yasuhiro Taniguchi, Kodaira (JP); Yasuhiko Kawashima, Kodaira (JP); Hideo Kasai, Kodaira (JP); Yutaka Shinagawa, Kodaira (JP); Ryotaro Sakurai, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 76 days.

(21) Appl. No.: 15/319,875

(22) PCT Filed: Jun. 17, 2015

(86) PCT No.: PCT/JP2015/067412
§ 371 (c)(1),
(2) Date: Dec. 19, 2016

(87) PCT Pub. No.: WO2015/194582
PCT Pub. Date: Dec. 23, 2015

(65) Prior Publication Data
US 2017/0133391 A1    May 11, 2017

(30) Foreign Application Priority Data
Jun. 20, 2014 (JP) ................. 2014-127706

(51) Int. Cl.
*H01L 27/148* (2006.01)
*H01L 27/11521* (2017.01)
(Continued)

(52) U.S. Cl.
CPC ...... *H01L 27/11521* (2013.01); *H01L 23/528* (2013.01); *H01L 23/5226* (2013.01);
(Continued)

(58) Field of Classification Search
CPC ......... H01L 27/11517; H01L 27/11519; H01L 27/11521; H01L 29/1087
(Continued)

(56) References Cited

U.S. PATENT DOCUMENTS 4,977,542 A * 12/1990 Matsuda .................. G11C 7/14
365/149
5,204,835 A * 4/1993 Eitan .................. G11C 16/0491
257/E27.103
(Continued)

FOREIGN PATENT DOCUMENTS

JP       10-189766 A    7/1998
JP     2001-135816 A    5/2001
(Continued)

OTHER PUBLICATIONS

International Search Report from Corresponding Application No. PCT/JP2015/067412; dated Sep. 2, 2015.

*Primary Examiner* — Jay C Kim
(74) *Attorney, Agent, or Firm* — Pearne & Gordon LLP

(57) ABSTRACT

In the non-volatile semiconductor memory device, a mobile charge collector layer, a mobile charge collecting contact, a mobile charge collecting first wiring layer, an in-between contact between the mobile charge collector layers, and a mobile charge collecting second wiring layer are disposed adjacent to a floating gate. Thereby, without increasing areas of active regions in the non-volatile semiconductor memory device, the number of mobile charges collected near the floating gate is reduced. The non-volatile semiconductor memory device allows high-speed operation of a memory cell while reducing fluctuations in a threshold voltage of the memory cell caused by collection of the mobile charges, which are attracted from an insulation layer, near the floating gate.

10 Claims, 5 Drawing Sheets

(51) Int. Cl.
　　　*H01L 27/11565*　　(2017.01)
　　　*H01L 27/1157*　　(2017.01)
　　　*H01L 23/522*　　(2006.01)
　　　*H01L 23/528*　　(2006.01)
　　　*H01L 27/11519*　　(2017.01)
　　　*H01L 29/06*　　(2006.01)
　　　*H01L 29/10*　　(2006.01)

(52) U.S. Cl.
　　　CPC .... *H01L 27/1157* (2013.01); *H01L 27/11519* (2013.01); *H01L 27/11565* (2013.01); *H01L 29/0684* (2013.01); *H01L 29/1087* (2013.01)

(58) Field of Classification Search
　　　USPC .......................................................... 257/214
　　　See application file for complete search history.

(56) References Cited

U.S. PATENT DOCUMENTS

| | | | | |
|---|---|---|---|---|
| 5,350,938 A * | 9/1994 | Matsukawa | H01L 27/115 | 257/316 |
| 5,579,259 A * | 11/1996 | Samachisa | G11C 5/025 | 257/316 |
| 5,796,142 A * | 8/1998 | Lin | H01L 21/84 | 257/316 |
| 5,798,965 A * | 8/1998 | Jun | H01L 27/108 | 257/E27.084 |
| 6,046,935 A * | 4/2000 | Takeuchi | G11C 11/5621 | 365/185.03 |
| 6,107,659 A * | 8/2000 | Onakado | G11C 16/26 | 257/318 |
| 6,226,198 B1 * | 5/2001 | Miwa | G11C 11/5621 | 365/185.03 |
| 6,438,030 B1 * | 8/2002 | Hu | G11C 16/0416 | 257/E21.682 |
| 6,456,534 B2 * | 9/2002 | Jinbo | G11C 16/3468 | 365/185.25 |
| 6,556,471 B2 * | 4/2003 | Chappell | G11C 11/412 | 365/154 |
| 6,646,930 B2 * | 11/2003 | Takeuchi | G11C 16/20 | 365/200 |
| 6,670,671 B2 * | 12/2003 | Sasago | H01L 27/115 | 257/319 |
| 6,711,064 B2 * | 3/2004 | Hsu | H01L 27/115 | 257/E21.694 |
| 6,845,042 B2 * | 1/2005 | Ichige | G11C 16/0483 | 257/E21.69 |
| 6,909,639 B2 * | 6/2005 | Park | G11C 16/0491 | 257/E21.682 |
| 6,925,008 B2 * | 8/2005 | Ichige | G11C 16/04 | 257/E21.69 |
| 7,042,044 B2 * | 5/2006 | Wu | G11C 11/5628 | 257/316 |
| 7,046,552 B2 * | 5/2006 | Chen | G11C 16/0425 | 257/314 |
| 7,095,651 B2 * | 8/2006 | Shirota | G11C 16/0433 | 257/E21.691 |
| 7,233,526 B2 * | 6/2007 | Umezawa | G11C 16/12 | 257/E21.682 |
| 7,259,992 B2 * | 8/2007 | Shirota | G11C 11/5642 | 365/185.18 |
| 7,332,766 B2 * | 2/2008 | Hasegawa | G11C 16/0433 | 257/314 |
| 7,495,294 B2 * | 2/2009 | Higashitani | H01L 27/115 | 257/208 |
| 7,538,338 B2 * | 5/2009 | Rinerson | G11C 11/5685 | 257/2 |
| 7,539,055 B2 * | 5/2009 | Enda | G11C 16/0483 | 365/185.17 |
| 7,598,561 B2 * | 10/2009 | Chen | H01L 29/7885 | 257/314 |
| 7,649,777 B2 * | 1/2010 | Ichige | G11C 16/0483 | 365/185.05 |
| 7,705,388 B2 * | 4/2010 | Iwata | G11C 16/0483 | 257/314 |
| 7,800,159 B2 * | 9/2010 | Widjaja | H01L 27/115 | 257/315 |
| 7,903,465 B2 * | 3/2011 | Haggag | G11C 16/0433 | 365/185.05 |
| 7,907,451 B2 * | 3/2011 | Iwasaki | G11C 16/0408 | 365/185.01 |
| 7,919,368 B2 * | 4/2011 | Wu | G11C 11/34 | 257/E21.409 |
| 7,951,669 B2 * | 5/2011 | Harari | G11C 16/0483 | 257/E21.681 |
| 8,026,544 B2 * | 9/2011 | Ito | G11C 11/5621 | 257/321 |
| 8,072,811 B2 * | 12/2011 | Lee | G11C 11/5628 | 365/185.17 |
| 8,098,509 B2 * | 1/2012 | Hazama | G11C 11/5628 | 257/316 |
| 8,320,180 B2 * | 11/2012 | Kalnitsky | G11C 16/0433 | 365/185.16 |
| 8,320,191 B2 * | 11/2012 | Strenz | G11C 16/0425 | 365/185.18 |
| 8,325,530 B2 * | 12/2012 | Lue | G11C 16/0416 | 365/185.18 |
| 8,351,254 B2 * | 1/2013 | Taniguchi | G11C 16/0433 | 257/315 |
| 8,488,388 B2 * | 7/2013 | Markov | G11C 16/0416 | 257/319 |
| 8,553,464 B2 * | 10/2013 | Nishi | H01L 27/11568 | 365/185.05 |
| 8,750,041 B2 * | 6/2014 | Georgescu | G11C 16/0458 | 257/315 |
| 8,823,073 B2 * | 9/2014 | Kobayashi | H01L 29/788 | 257/316 |
| 8,957,480 B2 * | 2/2015 | Deguchi | H01L 21/823425 | 257/368 |
| 8,958,245 B2 * | 2/2015 | Hsu | G11C 16/0441 | 257/315 |
| 8,981,445 B2 * | 3/2015 | Mitchell | H01L 27/11517 | 257/296 |
| 8,994,092 B2 * | 3/2015 | Yamakoshi | H01L 27/11524 | 257/316 |
| 9,025,358 B2 * | 5/2015 | Widjaja | G11C 11/4072 | 365/148 |
| 9,029,922 B2 * | 5/2015 | Han | G11C 16/0416 | 257/288 |
| 9,159,406 B2 * | 10/2015 | Higashitani | G11C 11/5628 | |
| 9,218,881 B2 * | 12/2015 | Yang | H01L 27/11524 | |
| 9,406,689 B2 * | 8/2016 | Li | H01L 21/845 | |
| 2005/0093056 A1 | 5/2005 | Lee | | |
| 2005/0104100 A1 | 5/2005 | Ishida et al. | | |
| 2006/0001081 A1 * | 1/2006 | Sasago | H01L 27/115 | 257/316 |
| 2006/0273373 A1 * | 12/2006 | Inoue | H01L 21/28273 | 257/315 |
| 2007/0004148 A1 * | 1/2007 | Yang | G11C 16/0483 | 438/264 |
| 2014/0151780 A1 * | 6/2014 | Park | H01L 27/11519 | 257/316 |

FOREIGN PATENT DOCUMENTS

| | | |
|---|---|---|
| JP | 2005-142571 A | 6/2005 |
| JP | 2005-175411 A | 6/2005 |
| JP | 2014-86435 A | 5/2014 |

* cited by examiner

NON-VOLATILE SEMICONDUCTOR MEMORY DEVICE

TECHNICAL FIELD

The present invention relates to a non-volatile semiconductor memory device and is suitably applied to a non-volatile semiconductor memory device in which floating gates capable of storing charges are arranged in a matrix of rows and columns.

BACKGROUND ART

Conventionally, non-volatile semiconductor memory devices in which memory cells are disposed at the intersections of bit lines and word lines have been known (see, for example, Patent Literature 1). A conventional memory cell comprises, for example, a floating gate capable of storing charges. In such a non-volatile semiconductor memory device, an insulation layer surrounds the floating gate of each memory cell and various types of wiring such as the bit lines and the word lines connected to the memory cells. The memory cells are insulated from each other and the various types of wiring are insulated from each other by the insulation layer.

CITATION LIST

Patent Literature

Patent Literature 1: Japanese Laid-Open Publication No. 2005-175411

SUMMARY OF INVENTION

Technical Problem

During a semiconductor production process of the above-described non-volatile semiconductor memory device, mobile charges (or carriers), for example, hydrogen ions ($H^+$) and sodium ions ($Na^+$), may be stored in an insulation layer, particularly, in the insulation layer between and over the wirings. In a case where charges (for example, electrons) are stored, for example, in the floating gate in the above-described memory cell, positive mobile charges in the insulation layer are scattered and collected near the floating gate and/or wiring and an active region close to the floating gate.

The collection of the mobile charges near the floating gate causes an effect that is substantially the same as the charging of the floating gate. For example, in a case where a charge injection transistor is an N-type MOS transistor in a memory cell, positive mobile charges close to the floating gate cause a drop in a threshold voltage (hereinafter simply referred to as (memory) cell threshold voltage) of each of the charge injection transistor, a readout transistor, and a charge removal transistor. Recently, miniaturization of the non-volatile semiconductor memory devices has been prevailing, so that a layout is determined to make the active regions in a control capacitor, the charge injection transistor, the readout transistor, and the charge removal transistor as small as possible.

For this reason, in the conventional non-volatile semiconductor memory device, the collection of the mobile charges attracted from the insulation layer may not occur in the active region because the area of the active region is small. However, the collection of the mobile charges occurs mainly near the floating gate and the wiring close to the floating gate. Thus the number of the mobile charges collected near (or attracted to) the floating gate in the non-volatile semiconductor memory device is increased, causing large fluctuations in the cell threshold voltage. The fluctuations in the threshold voltage occur more significantly, in particular, in the non-volatile memory disclosed in Patent Literature 1, in which a memory cell is composed only of a single-layer polysilicon, because the floating gate is exposed to the insulation layer disposed between the wirings, unlike a stack-gate type non-volatile memory, in which most of the floating gate is covered by a control gate. The large fluctuations in the cell threshold voltage may cause a failure such as inversion of information stored in the memory cell, resulting in lack of reliability of the information stored in the memory cell.

In order to solve the aforementioned problems, the number of mobile charges attracted to the floating gate may be relatively reduced by increasing the area of each of the active regions in the non-volatile semiconductor memory device. However, in such a non-volatile semiconductor memory device, a junction capacity between the active region and the well increases as the area of the active region increases. Accordingly, it becomes difficult to maintain high-speed performance of the memory cell.

In view of the foregoing, an object of the present invention is to suggest a non-volatile semiconductor memory device capable of achieving high-speed performance of a memory cell while reducing fluctuations in the cell threshold voltage caused by the collection of the mobile charges near the floating gate, the mobile charges being attracted from the insulation layer.

Solution to Problem

In order to solve the foregoing problems, a non-volatile semiconductor memory device according to the present invention comprises: a plurality of floating gates surrounded by an insulation layer and electrically isolated from each other; memory cells including the respective floating gates; and a mobile charge collector configured to attract mobile charges from the insulation layer to at least one of a between-column region and a between-row region and reducing collection of the mobile charges near the floating gate, the between-column region being disposed between the neighboring floating gates in a row direction, the between-row region being disposed between the neighboring floating gates in a column direction.

Advantageous Effects of Invention

According to the present invention, the number of the mobile charges to be attracted to the floating gate is reduced without increasing the area of each of the active regions. Thereby the fluctuations in the cell threshold voltage caused by the collection of the mobile charges, which are attracted from the insulation layer, near the floating gate is reduced while the memory cell's high-speed performance, similar to that of a conventional memory cell, is maintained.

DESCRIPTION OF EMBODIMENTS

Referring to drawings, embodiments of the present invention will be described below in details.

Figure 1:
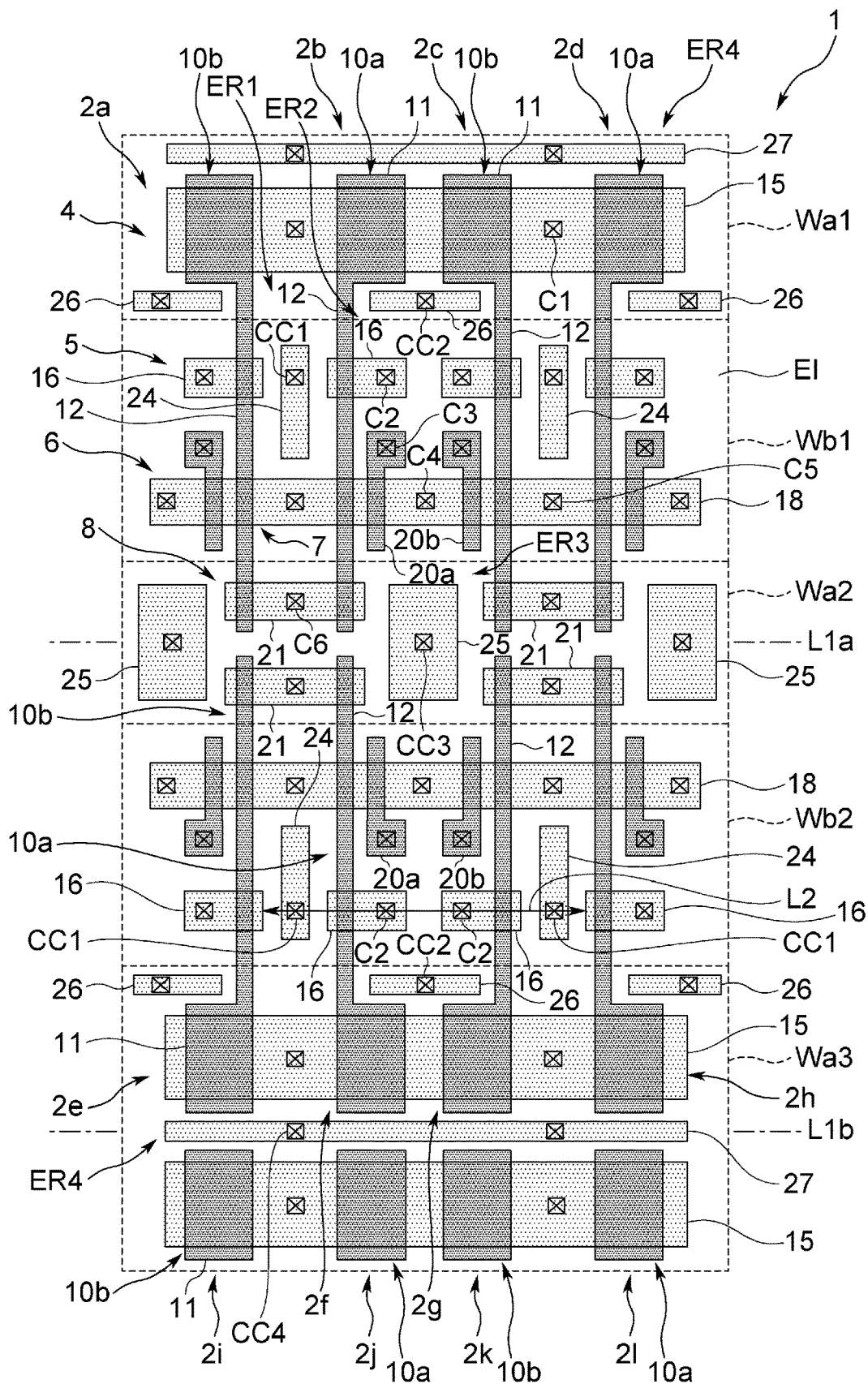
FIG. 1 is a schematic view illustrating a layout of a non-volatile semiconductor memory device according to an embodiment of the present invention.

In FIG. 1, a reference numeral 1 denotes a non-volatile semiconductor memory device of the present invention and comprises memory cells 2a, 2b, 2c, 2d, 2e, 2f, 2g, 2h, 2i, 2j, 2k, and 2l arranged in a matrix (of 3 rows and 4 columns). The memory cells 2a, 2b, 2c, 2d, 2e, 2f, 2g, 2h, 2i, 2j, 2k, and 2l have the same configuration. With regard to the memory cells 2i, 2j, 2k, and 2l in a third row in FIG. 1, only a part thereof (control capacitors 4 (which will be described below)), which is disposed adjacent to the memory cells 2e, 2f, 2g, and 2h in the second row, is described. In this embodiment, the memory cells 2a, 2b, 2c, and 2d in a first row and the memory cells 2e, 2f, 2g, and 2h in a second row are described.

Each of the memory cells 2a, 2b, 2c, 2d, 2e, 2f, 2g, 2h, 2i, 2j, 2k, and 2l comprises the control capacitor 4, a charge injection transistor 5, a switch transistor 6, a readout transistor 7, and a charge removal transistor 8. In each of the memory cells 2a, 2b, 2c, 2d, 2e, 2f, 2g, 2h, 2i, 2j, 2k, and 2l, one floating gate 10a or one floating gate 10b is shared by the control capacitor 4, the charge injection transistor 5, the readout transistor 7, and the charge removal transistor 8, and the switch transistor 6 comprises a switch gate 20a or a switch gate 20b.

The floating gate 10a is symmetric with the floating gate 10b with respect to a boundary between the neighboring memory cells, for example, the memory cells 2a and 2b, the memory cells 2b and 2c, or the memory cells 2c and 2d, which are next to each other in a row direction. The floating gates 10a and the floating gates 10b are arranged alternately in the row direction. The switch gate 20a is symmetric with the switch gate 20b with respect to the boundary between the neighboring memory cells, for example, the memory cells 2a and 2b, the memory cells 2b and 2c, or the memory cells 2c and 2d, which are next to each other in the row direction. The switch gates 20a and the switch gates 20b are arranged alternately the row direction.

In this case, each of the floating gates 10a and the floating gate 10b comprises a wide region 11 and a narrow region 12, which is narrower in width than the wide region 11. The wide region 11, which is wider in width than the narrow region 12, functions as a gate electrode of the control capacitor 4. The narrow region 12, which is narrower in width than the wide region 11, functions as a gate electrode of each of the charge injection transistor 5, the readout transistor 7, and the charge removal transistor 8.

In FIG. 1, an area of intersection between the wide region 11, which is disposed in the control capacitor 4, and a first active region 15, in which the control capacitor 4 is formed, is greater than a sum of an area of intersection between the narrow region 12, which is disposed in the charge injection transistor 5, and the second active region 16, in which the charge injection transistor 5 is formed, and an area of intersection between the narrow region 12, which is disposed in the charge removal transistor 8, and a fourth active region 21, in which the charge removal transistor 8 is formed. Due to the large area of intersection between the first active region 15 and the wide region 11 in the capacitor 4, potential is easily transmitted from the first active region 15, in which the control capacitor 4 is disposed, to the floating gate 10b of the memory cell 2a, for example. The large area of intersection allows generating a large amount of tunnel current in the narrow region 12 in the charge injection transistor 5 at the time of writing (programming) data. Thus a large amount of charges is injected into the floating gate 10b from a channel region in the charge injection transistor 5.

In this embodiment, in the non-volatile semiconductor memory device 1, a first-conductivity-type well Wa1, a second-conductivity-type well Wb1, a first-conductivity-type well Wa2, a second-conductivity-type well Wb2, and a first-conductivity-type well Wa3 (hereinafter, may be called collectively as "well") are disposed in this order on a semiconductor substrate (not shown), and element isolation layers EI comprising, for example, silicon oxide are disposed in the first-conductivity-type wells Wa1, Wa2, Wa3, and the second-conductivity-type wells Wb1, and Wb2. In this embodiment, N-type first-conductivity-type wells Wa1, Wa2, Wa3 and P-type second-conductivity-type wells Wb1 and Wb2 are employed by way of example. The present invention is not limited to this. P-type first-conductivity-type wells Wa1, Wa2, Wa3 and N-type second-conductivity-type wells Wb1 and Wb2 may be employed.

In the non-volatile semiconductor memory device 1, the memory cells 2a, 2b, 2c, and 2d are arranged in parallel and extend in the first-conductivity-type well Wa1, the second-conductivity-type well Wb1, and the first-conductivity-type well Wa2, and share the first-conductivity-type well Wa2 with the memory cells 2e, 2f, 2g, and 2h of a subsequent row. The memory cells 2e, 2f, 2g, and 2h are arranged in parallel and extend in the first-conductivity-type well Wa2, the second-conductivity-type well Wb2, and the first-conductivity-type well Wa3.

In the first-conductivity-type well Wa1, the first active region 15 extends across the memory cells 2a, 2b, 2c, and 2d in the row direction. The memory cells 2a, 2b, 2c, and 2d have their respective control capacitors 4 in the first active region 15. The wide regions 11 of the floating gates 10a and 10b are disposed in the first active region 15. The memory cells 2a, 2b, 2c, and 2d have the respective wide regions 11, each corresponding to the floating gate 10a or 10b. A contact C1 is disposed in a region in the first active region 15, other than the regions in which the wide regions 11 of the floating gates 10a and 10b are disposed. A control gate line (not shown) is connected as wiring to the contact C1. Thus, voltage(s) applied to the control gate lines is applied to the memory cells 2a, 2b, 2c, and 2d through the contacts C1 and the first active region 15.

In the second-conductivity-type well Wb1, which is next to the first-conductivity-type well Wa1, the second active regions 16 are disposed in the memory cells 2a, 2b, 2c, and 2d, respectively. The charge injection transistors 5 of the memory cells 2a, 2b, 2c, and 2d are disposed in the corresponding second active regions 16, respectively. In the second active region 16 of each of the memory cells 2a, 2b, 2c, and 2d, the narrow region 12 of the floating gate 10a or the floating gate 10b is disposed. In each of the second active regions 16, a contact C2 is disposed in a region other than the narrow region 12.

Write bit lines (not shown) are connected to the contacts C2 disposed in the row direction in the second active regions 16, respectively. Thus, voltage(s) are applied to the memory cells 2a, 2b, 2c, and 2d through the write bit lines and the contacts C2. In this case, a difference between the voltage applied through the write bit line and the voltage applied to the control capacitor 4 causes the charge injection transistor 5 to inject charges into the floating gate 10a or 10b to write data, for example.

In addition to the second active regions 16, a third active region 18, which extends in the row direction across the memory cells 2a, 2b, 2c, and 2d, is disposed in the second-conductivity-type well Wb1. In the third active region 18, the switch transistor 6 and the readout transistor 7 are disposed for each of the memory cells 2a, 2b, 2c, and 2d. In the third active region 18, the narrow regions 12 of the floating gates 10a and 10b are disposed and the switch gates 20a and 20b are disposed.

In each of the switch gates 20a and 20b, a contact C3 connected to a switch gate line (not shown) is disposed. A switch gate voltage applied to the switch gate line is applied through the contact C3 to the corresponding switch gates 20a or 20b. In the third active region 18, other than the regions in which the switch gates 20a and 20b and the floating gates 10a and 10b are disposed, contacts C4 and contacts C5 are disposed, the contacts C4 being connected to the respective read bit lines (not shown) and each contact C4 being adjacent to the switch gates 20a and 20b, the contacts C5 being connected to the respective source lines (not shown) and each contact C5 being adjacent to the floating gates 10a and 10b of the readout transistor 7.

In this embodiment, the switch transistor 6 is connected in series with the readout transistor 7, and turns on when a switch gate voltage is applied to the switch gate 20a or 20b. Thus the readout transistor 7 is electrically connected to the read bit line. The voltage on the read bit line varies depending on the presence or absence of charge (the presence or absence of written data) in the floating gate 10a or 10b. Based on a change in the voltage on the read bit line at the time of reading data, the non-volatile semiconductor memory device 1 determines whether charge has been stored in the floating gate 10a or 10b or not. Note that the voltage on the bit line is applied to the readout transistor 7 in the third active region 18 through the contact C4.

A fourth active region 21 shared by the neighboring memory cells 2a and 2b and another fourth active region 21 shared by the neighboring memory cells 2c and 2d are disposed in the first-conductivity-type well Wa2, which is next to the second-conductivity-type well Wb1. The charge removal transistor 8 of each of the memory cells 2a and 2b is disposed in the fourth active region 21 shared by the neighboring memory cells 2a and 2b. The charge removal transistor 8 of each of the memory cells 2c and 2d is disposed in another fourth active region 21 shared by the neighboring memory cells 2c and 2d. In each of the fourth active regions 21, for example, the narrow regions 12 of the floating gates 10a and 10b are disposed and a contact C6 is disposed in a region other than the regions in which the narrow regions 12 are disposed.

In each of the fourth active regions 21, an erase gate line (not shown) is connected to the contact C6. Thus a voltage applied to the erase gate line is applied to the fourth active region 21 through the contact C6. In this case, a difference between the voltage applied through the erase gate line and the voltage applied to the control capacitor 4 causes the charge removal transistor 8 to remove charges stored in the floating gate 10a or 10b to erase data in the memory cell 2a, 2b, 2c, 2d, or the like.

In the non-volatile semiconductor memory device 1, the memory cells 2a, 2b, 2c, and 2d arranged in the row direction in the first row are symmetric with the memory cells 2e, 2f, 2g, and 2h arranged in the row direction in the subsequent row (second row) along with the memory cells 2a, 2b, 2c, and 2d, with respect to a boundary L1a between the memory cells (2a, 2b, 2c, and 2d) and the memory cells (2e, 2f, 2g, and 2h). In the first-conductivity-type well Wa2 of the non-volatile semiconductor memory device 1, the charge removal transistors 8 of the memory cells 2a, 2b, 2c, and 2d arranged in the first row and the charge removal transistors 8 of the memory cells 2e, 2f, 2g, and 2h arranged in the subsequent row (the second row) are disposed. Thus, one first-conductivity-type well Wa2 is shared by the memory cells 2a, 2b, 2c, 2d arranged in one row and the memory cells 2e, 2f, 2g, and 2h arranged in another row.

In a second-conductivity-type well Wb2 disposed next to the first-conductivity-type well Wa2, the third active region 18 and the second active region 16 are disposed, in which the memory cells 2e, 2f, 2g, and 2h of the second row are formed. In a first-conductivity-type well Wa3 next to the second-conductivity-type well Wb2, the first active region 15 is disposed, in which the memory cells 2e, 2f, 2g, and 2h of the second row are formed. Note that the descriptions of the first active region 15, the second active region 16, the third active region 18, and the fourth active region 21, in which the memory cells 2e, 2f, 2g, and 2h of the second row are formed, are omitted to avoid repetition.

In the above-described non-volatile semiconductor memory device 1, the memory cells 2e, 2f, 2g, and 2h arranged in the row direction in the second row are symmetric with the memory cells 2i, 2j, 2k, and 2l arranged in the row direction in a subsequent row (third row) along with the memory cells 2e, 2f, 2g, and 2h, with respect to a boundary L1b between the memory cells (2e, 2f, 2g, and 2h) and the memory cells (2i, 2j, 2k, and 2l). Hence, in the first-conductivity-type well Wa3 of the non-volatile semiconductor memory device 1, the control capacitors 4 of the memory cells 2e, 2f, 2g, and 2h of the second row and the control capacitors 4 of the memory cells 2i, 2j, 2k, and 2l of the subsequent row are formed.

Hereinafter, configuration of the wide regions 11 and the narrow regions 12 of the above described floating gates 10a and 10b are described in details. In this embodiment, in the floating gate 10a, the linear narrow region 12 is formed integrally along with one side of the four-sided wide region 11, for example. The floating gate 10a has a width-spacing region (space or cutout) on the other side opposite to the side on which the narrow region 12 is formed, the wide-spacing region having a width that is equal to a difference in width between the wide region 11 and the narrow region 12. In the floating gate 10b, the linear narrow region 12 is formed integrally along with one side of the wide region 11, and the width-spacing region having a width that is equal to a difference in width between the wide region 11 and the narrow region 12 is formed on the other side of the wide region 11.

In this embodiment, the floating gate 10b is disposed in the memory cell 2a located at the intersection of the first row and the first column. The floating gate 10a is disposed in the memory cell 2b located at the intersection of the first row and the second column, the memory cell 2b being next to the memory cell 2a. Another floating gate 10b is disposed in the memory cell 2c located at the intersection of the first row and the third column, the memory cell 2c being next to the memory cell 2b. Another floating gate 10a is disposed in the memory cell 2d located at the intersection of the first row and the fourth column, the memory cell 2d being next to the memory cell 2c.

Hence, in the memory cells 2a and 2b next to each other in the row direction, the linear side of the floating gate 10b faces the linear side of the floating gate 10a with predetermined spacing between the linear sides. A between-column region ER1, in which the narrow region 12 of the floating gate 10b is close to the narrow region 12 of the floating gate 10a, is disposed between the memory cells 2a and 2b that are next to each other in the row direction. Note that in the third active region 18, the contact C5 is disposed at a position within the between-column region ER1.

In addition, in the non-volatile semiconductor memory device 1 according to the present invention, a mobile charge collector layer 24 is disposed on a surface of the second-conductivity-type well Wb1 in the between-column region ER1. The mobile charge collector layer 24, which functions as a mobile charge collector, is formed by doping impurities, for example, boron (B), indium (In), or the like. Thereby fluctuations in potential at the surface of the well are reduced, so that mobile charges (or carriers) in an insulation layer, which surrounds the first-conductivity-type wells Wa1, Wa2, and Wa3 and the second-conductivity-type wells Wb1 and Wb2, and the floating gates 10a and 10b, are efficiently collected (or attracted) and thus the collection of the mobile charges near the floating gates 10a and 10b and various types of wiring is reduced.

In addition, in the non-volatile semiconductor memory device 1, a silicide layer (not shown), which contains silicide such as CoSix or NiSix, may be disposed over a surface of the mobile charge collector layer 24. The silicide layer lowers the resistance on the surface of the mobile charge collector layer 24 and thereby the mobile charge collector layer 24 efficiently collects the mobile charges.

In this embodiment, the mobile charge collector layer 24 has a rectangular shape, and its lengthwise direction extends along the lengthwise direction of the narrow regions 12 of the floating gates 10a and 10b. Thus, in the between-column region ER1, the mobile charge collector layer 24 is disposed along the narrow regions 12 of the floating gates 10a and 10b and thereby attracts the mobile charges from the insulation layer (not shown) close to the narrow regions 12 of the floating gates 10a and 10b. As a result, the collection of the mobile charges near the floating gates 10a and 10b is reduced.

Note that the mobile charge collector layer 24 is not in contact with the floating gates 10a and 10b, and the first active region 15, the second active region 16, and the third active region 18 that are connected to the floating gates 10a and 10b. Hence the mobile charge collector 24 does not contribute to data writing (programming) operation, data reading operation, and data erasing operation performed on the memory cells 2a and 2b.

The position of the mobile charge collector layer 24 disposed in the between-column region ER1 is determined based on the positions of the narrow regions 12 of the floating gates 10a and 10b. The mobile charge collector layer 24 is disposed at an equal distance from each of the narrow regions 12 of the floating gates 10a and 10b. The mobile charge collector layer 24 is disposed in the middle between the floating gates 10a and 10b next to each other in the row direction. The mobile charge collector layer 24 is disposed at an equal distance from each of the second active region 16 connected to the floating gate 10b and the second active region 16 connected to the floating gate 10a. The mobile charge collector layer 24 is disposed in the middle between the second active regions 16 that are next to each other.

Hence the mobile charge collector layer 24 disposed in the between-column region ER1 attracts the mobile charges that are present close to the floating gates 10a and 10b of the memory cells 2a and 2b (2c and 2d, 2e and 2f, or 2g and 2h), which are next to each other in the row direction. Thus the collection of the mobile charges near the floating gates 10a and 10b is reduced concurrently.

A pillar-shaped mobile charge collecting contact CC1 is disposed in a standing manner on a surface of the mobile charge collector layer 24. In this embodiment, the mobile charge collecting contact CC1 comprises a metal member containing, for example, tungsten (W), cupper (Cu), or aluminum (Al), and collects the mobile charges from the insulation layer in a manner similar to the mobile charge collector layer 24. In this embodiment, the mobile charge collecting contact CC1 is disposed at an equal distance from each of the narrow regions 12 of the floating gates 10a and 10b, in a manner similar to the mobile charge collector layer 24. The mobile charge collecting contact CC1 is disposed in the middle between the floating gates 10a and 10b, which are next to each other in the row direction.

Note that the mobile charge collecting contact CC1 is not in contact with the floating gates 10a and 10b, and the first active region 15, the second active region 16, and the third active region 18 that are connected to the floating gates 10a and 10b. Hence the mobile charge collecting contact CC1 does not contribute to data writing operation, data reading operation, and data erasing operation performed on the memory cells 2a and 2b.

In the memory cells 2b and 2c, which are next to each other in the row direction, the width-spacing region side of the floating gate 10a faces the width-spacing region side of the floating gate 10b. Accordingly, a between-column region ER2 is disposed, in which the distance between the narrow regions 12 facing each other in the row direction is greater than the distance between the wide regions 11 facing each other in the row direction. The contact C2, which is formed in the second active region 16, is disposed within the between-column region ER2. In addition, in the between-column region ER2, the switch gates 20a and 20b of the memory cells 2b and 2c are disposed and the contact C4, to which the read bit line (not shown) is connected, is disposed in the third active region between the switch gates 20a and 20b.

The between-column region ER2 is surrounded by width difference portions, each of which corresponds to a difference in width between the wide region 11 and the narrow region 12 of the floating gate 10a or 10b, the narrow regions 12 of the floating gates 10a and 10b that are next to each other in the row direction, the first active region 15, and the second active region 16, and a mobile charge collector layer 26 is disposed on a surface of the first-conductivity-type well Wa1, over which the wide regions 11 of the floating gates 10a and 10b are disposed. The mobile charge collector layer 26 is formed by doping impurities, for example, phosphorus (P), arsenic (As), or antimony (Sb), in a manner similar to the mobile charge collector layer 24 described above.

The mobile charge collector layer 26 collects the mobile charges from the insulation layer that surrounds the first-conductivity-type wells Wa1, Wa2, and Wa3, the second-conductivity-type wells Wb1 and Wb2, and the floating gates 10a and 10b. Thereby the mobile charge collector layer 26 reduces the collection of the mobile charges near the floating gates 10a and 10b, various types of wiring, and the like.

In this embodiment, the mobile charge collector layer 26 has a rectangular shape, with its lengthwise direction disposed in a direction orthogonal to the lengthwise direction of the narrow regions 12 of the floating gates 10a and 10b. The mobile charge collector layer 26 is disposed between the narrow regions 12 of the floating gates 10a and 10b next to each other in the row direction. Note that the mobile charge collector layer 26 is not in contact with the floating gates 10a and 10b and the first and second active regions 15 and 16 connected to the floating gates 10a and 10b. Hence the mobile charge collector layer 26 does not contribute to data writing operation, data reading operation, and data erasing operation performed on the memory cells 2b and 2c.

The position of the mobile charge collector layer 26 disposed in the between-column region ER2 is determined based on the positions of the narrow regions 12 of the floating gates 10a and 10b. The mobile charge collector layer 26 is disposed at an equal distance from each of the narrow region 12 of the floating gate 10a and the narrow region 12 of the floating gate 10b. The mobile charge collector layer 26 is disposed in the middle between the floating gates 10a and 10b next to each other in the row direction.

A pillar-shaped mobile charge collecting contact CC2 is disposed in a standing manner on a surface of the mobile charge collector layer 26. The mobile charge collecting contact CC2 comprises a metal member containing, for example, tungsten (W), cupper (Cu), or aluminum (Al), similar to the mobile charge collecting contact CC1 disposed in the between-column region ER1. The mobile charge collecting contact CC2 collects the mobile charges from the insulation layer, in a manner similar to the mobile charge collector layer 24. Note that the mobile charge collecting contact CC2 is disposed at an equal distance from each of the narrow regions 12 of the floating gates 10a and 10b, in a manner similar to the mobile charge collector layer 26. The mobile charge collecting contact CC2 is disposed in the middle between the floating gates 10a and 10b next to each other in the row direction.

Note that the mobile charge collecting contact CC2 is not in contact with the floating gates 10a and 10b, and the first and second active regions 15 and 16 connected to the floating gates 10a and 10b. Thus, the mobile charge collecting contact CC2 does not contribute to data writing operation, data reading operation, and data erasing operation performed on the memory cells 2b and 2c.

In the non-volatile semiconductor memory device 1, a mobile charge collector layer 25 is disposed in a between-column region ER3, through which the between-column region ER2 that is between the memory cells 2b and 2c and the between-column region ER2 that is between the memory cells 2f and 2g are connected, the memory cells 2b and 2c being next to each other in the row direction, the memory cells 2f and 2g being disposed in a subsequent row and next to the memory cells 2b and 2c, respectively. The mobile charge collector layer 25 disposed in the between-column region ER3 collects the mobile charges present in the insulation layer that surrounds the first-conductivity-type wells Wa1, Wa2, and Wa3, the second-conductivity-type wells Wb1 and Wb2, the floating gates 10a and 10b, and the like, and thereby reduces the collection of the mobile charges near the floating gates 10a and 10b, various types of wiring, and the like.

The mobile charge collector layer 25 is formed by doping impurities, for example, phosphorus (P), arsenic (As), or antimony (Sb), on the surface of the first-conductivity-type well Wa2, in which the charge removal transistors 8 of the memory cells 2b and 2c and the charge removal transistors 8 of the memory cells 2f and 2g are disposed, the memory cells 2b and 2c being symmetric with and next to the memory cells 2f and 2g, respectively, in the column direction.

The mobile charge collector layer 25, which is in the first-conductivity-type well Wa2 in the between-column region ER3, is disposed in a region surrounded by the switch gates 20a and 20b and the narrow regions 12 of the floating gates 10a and 10b of the memory cells 2b and 2c in one row and the switch gates 20a and 20b and the narrow regions 12 of the floating gates 10a and 10b of the memory cells 2f and 2g, which are disposed in a next (neighboring) row in the column direction and symmetric with the memory cells 2b and 2c.

In this embodiment, the mobile charge collector layer 25 has a rectangular shape and is disposed such that a lengthwise direction thereof extends along a lengthwise direction of the narrow regions 12 of the floating gates 10a and 10b. Note that the mobile charge collector layer 25 is not in contact with the floating gates 10a and 10b of the memory cells 2b, 2c, 2f, and 2g, and the fourth active region 21, the third active region 18, and the switch gates 20a and 20b that are connected to the floating gates 10a and 10b. Hence the mobile charge collector layer 25 does not contribute to data writing operation, data reading operation, and data erasing operation performed on the memory cells 2b, 2c, 2f, and 2g.

In this embodiment, a position of the mobile charge collector layer 25 disposed in the between-column region ER3 is determined based on the positions of the narrow regions 12 of the floating gates 10a and 10b. The mobile charge collector layer 25 is disposed at an equal distance from each of the narrow regions 12 of the floating gates 10a and 10b. The mobile charge collector layer 25 is disposed in the middle between the floating gates 10a and 10b next to each other in the row direction.

A pillar-shaped mobile charge collecting contact CC3 is disposed in a standing manner on a surface of the mobile charge collector layer 25. In this embodiment, the mobile charge collecting contact CC3 comprises a metal member containing, for example, tungsten (W), cupper (Cu), or aluminum (Al), similar to the mobile charge collecting contact CC1 or CC2, and collects the mobile charges from the insulation layer in a manner similar to the mobile charge collector layer 25. Note that the mobile charge collecting contact CC3 is disposed at an equal distance from each of the narrow regions 12 of the floating gates 10a and 10b. The mobile charge collecting contact CC3 is disposed in the middle between the floating gates 10a and 10b next to each other in the row direction and between the floating gates 10a and 10a (or 10b and 10b) next to each other in the column direction.

Note that the mobile charge collecting contact CC3 is not in contact with the floating gates 10a and 10b, and the third and fourth active regions 18 and 21 connected to the floating gates 10a and 10b. Hence the mobile charge collecting contact CC3 does not contribute to the data writing operation, the data reading operation, and the data erasing operation performed on the memory cells 2b, 2c, 2f, and 2g.

In the non-volatile semiconductor memory device 1, a mobile charge collector layer 27 is disposed in a between-row region ER4, in which the wide regions 11 of the floating gates 10a and 10a (or 10b and 10b) in different rows (in neighboring rows) face each other. The between-row region ER4 extends between the memory cells 2e, 2f, 2g, and 2h disposed in one row and the memory cells 2i, 2j, 2k, and 2l disposed in the subsequent row. The memory cells 2e, 2f, 2g, and 2h are arranged next to the memory cells 2i, 2j, 2k, and 2l, respectively, in the column direction. The wide regions 11 of the floating gates 10a or the floating gates 10b face each other in the between-row region ER4, in which the mobile charge collector layer 27 is disposed.

Similar to the mobile charge collector layers 24, 25, and 26, the mobile charge collector layer 27, which is disposed in the between-row region ER4, collects the mobile charges from the insulation layer, which surrounds the first-conductivity-type wells Wa1, Wa2, and Wa3, the second-conductivity-type wells Wb1 and Wb2, and the floating gates 10a and 10b. Thereby the collection of the mobile charges near the floating gates 10a and 10b and various types of wiring is reduced. The mobile charge collector layers 27 are formed by doping impurities, for example, boron (B), indium (In), or the like on the surfaces of the first-conductivity-type wells Wa1 and Wa3, in which the wide regions 11 of the floating gates 10a and 10b are disposed.

In this embodiment, the mobile charge collector layer 27 has a rectangular shape, for example. A lengthwise direction of the mobile charge collector layer 27 extends along a lengthwise direction of the first active region 15 extending in the row direction. The mobile charge collector layer 27 may extend across a region between the memory cells 2e, 2f, 2g, and 2h arranged in the row direction and the memory cells 2i, 2j, 2k, and 2l arranged in the subsequent (neighboring) row.

In this embodiment, the position of the mobile charge collector layer 27 disposed in the between-row region ER4 is determined by the position of the wide region 11 of the floating gate 10a or 10b in one row and the position of the wide region 11 of the floating gate 10a or 10b in a neighboring row in the column direction. The position of the mobile charge collector layer 27 is disposed at an equal distance from each of the wide region 11 of the floating gate 10a or 10b in one row and the wide region 11 of the floating gate 10a or 10b in a neighboring row in the column direction. The mobile charge collector layer 27 is disposed in the middle between the floating gates 10a and 10a (or 10b and 10b) that are next to each other in the column direction.

Note that the mobile charge collector layer 27 is not in contact with the floating gates 10a and 10b of the memory cells 2e, 2f, 2g, 2h, 2i, 2j, 2k, and 2l and the first active region 15 connected to the floating gates 10a and 10b. Hence the mobile charge collector layer 27 does not contribute to the data writing operation, the data reading operation, and the data erasing operation performed on the memory cells 2e, 2f, 2g, 2h, 2i, 2j, 2k, and 2l.

Pillar-shaped mobile charge collecting contacts CC4 are disposed in a standing manner on the surface of the mobile charge collector layer 27. The mobile charge collecting contact CC4 comprises a metal member containing, for example, tungsten (W), cupper (Cu), or aluminum (Al), similar to the mobile charge collecting contacts CC1, CC2, or CC3. The mobile charge collecting contact CC4 collects the mobile charges from the insulation layer, in a manner similar to the mobile charge collector layer 27. Note that the mobile charge collecting contact CC4 is disposed at an equal distance from each of the wide regions 11 of the floating gates 10a and 10b of the rows next to each other in the column direction. The mobile charge collecting contact CC4 is disposed in the middle between the floating gates 10a and 10b that are next to each other in the column direction.

Note that the mobile charge collecting contact CC4 is not in contact with the floating gates 10a and 10b of the memory cells 2e, 2f, 2g, 2h, 2i, 2j, 2k, and 2l and the first active region 15 connected to the floating gates 10a and 10b. Hence the mobile charge collecting contact CC4 does not contribute to the data writing operation, the data reading operation, and the data erasing operation performed on the memory cells 2e, 2f, 2g, 2h, 2i, 2j, 2k, and 2l.

In addition, in the non-volatile semiconductor memory device 1, the silicide layers (not shown), which contain silicide such as CoSix or NiSix, may be disposed over the surfaces of the mobile charge collector layers 25, 26, and 27, respectively, in a manner similar to the mobile charge collector layer 24. The silicide layers reduce the resistance on the surfaces of the mobile charge collector layers 25, 26, and 27, thereby allowing the mobile charge collector layers 25, 26, and 27 to collect the mobile charges more efficiently.

Figure 2:
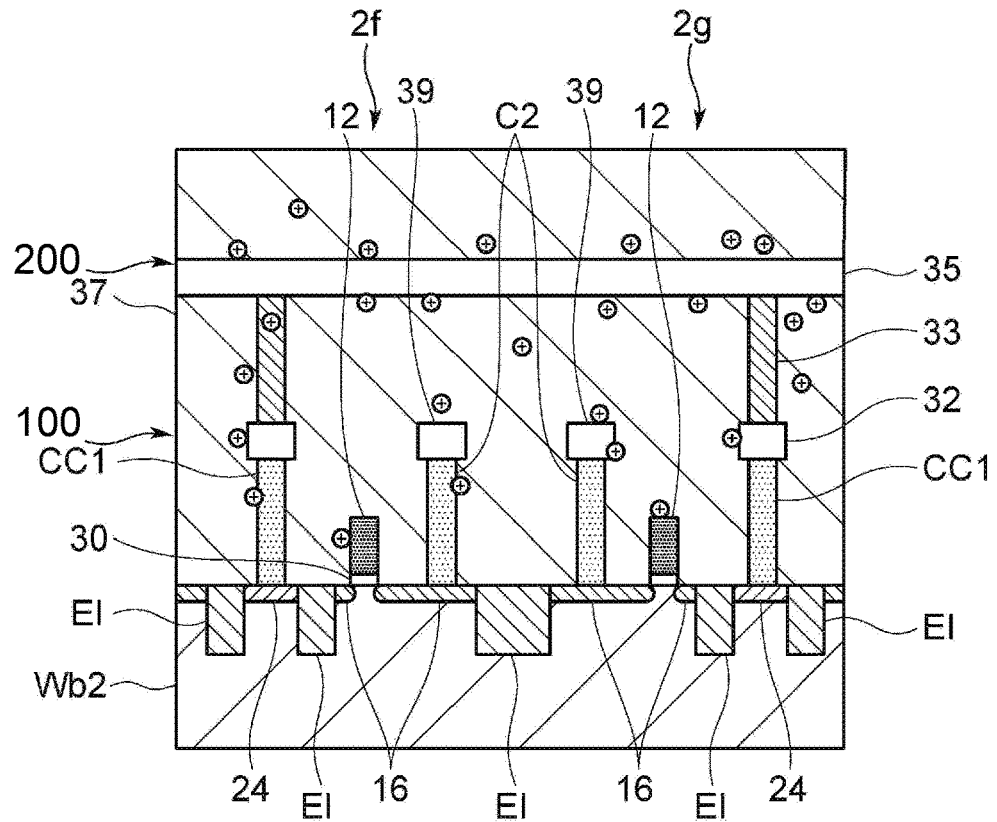
FIG. 2 is a cross-sectional view illustrating a cross-section cut along a straight line L2 in the non-volatile semiconductor memory device shown in FIG. 1.

In this embodiment, the mobile charge collecting contacts CC1, CC2, CC3, and CC4 have the same configuration. In the following, the mobile charge collecting contact CC1 disposed on the mobile charge collector layer 24 will be described. FIG. 2 shows a cross-section of FIG. 1 cut along a straight line L2 extending in the second active regions 16 in the memory cells 2f and 2g in the second row. In this case, as shown in FIG. 2, the element isolation layers EI are disposed in the second-conductivity-type well Wb2. In the second-conductivity-type well Wb2, the narrow region 12 is disposed, through a gate insulation film 30, between regions in which the second active regions 16 are disposed.

In this case, the contact C2 is disposed in a standing manner on each of the second active region 16 in the memory cell 2f and the second active region 16 in the memory cell 2g, which is disposed next to the memory cell 2f in the row direction. A write bit line 39 is disposed at an end of the contact C2, the write bit line 39 being disposed at the position of (or the position corresponding to the position of) a first wiring layer 100.

The mobile charge collecting contact CC1 is disposed in a standing manner on the mobile charge collector layer 24, which is on the surface of the second-conductivity-type well Wb2. A mobile charge collecting first wiring layer 32, which comprises a metal member containing, for example, tungsten (W), cupper (Cu), or aluminum (Al), is disposed at an end of the mobile charge collecting contact CC1. The mobile charge collecting first wiring layer 32 is disposed at the position of (or the position corresponding to the position of) the first wiring layer 100 in which the wiring such as the write bit line 39 is disposed.

A pillar-shaped in-between contact 33 for collecting mobile charges is disposed in a standing manner between the mobile charge collector layers and extends toward a second wiring layer 200, which is disposed above the first wiring layer 100, the in-between contact 33 being disposed on the mobile charge collecting first wiring layer 32. Note that wiring (e.g. a word line) comprising tungsten (W), cupper (Cu), or aluminum (Al) is disposed in the second wiring layer 200. The in-between contact 33, which comprises a metal member containing, for example, tungsten (W), cupper (Cu), or aluminum (Al), electrically connects a mobile charge collecting second wiring layer 35, which is disposed at an end of the in-between contact 33, with the mobile charge collecting first wiring layer 32. In this embodiment, the mobile charge collecting second wiring layer 35 extends in the row direction, for example, and is electrically connected to another in-between contact 33 disposed in the same row.

An insulation layer 37 surrounds the contacts C2, the floating gates 10a and 10b, the mobile charge collecting contacts CC1, the mobile charge collecting first wiring layers 32, the in-between contacts 33, and the mobile charge collecting second wiring layer 35, which are disposed over the second-conductivity-type well Wb2. For example, the floating gates 10a and 10b are isolated from each other by the insulation layer 37 and the wiring is isolated from another wiring by the insulation layer 37.

For example, in a case where charges are injected into the floating gates 10a and 10b of the memory cells 2f and 2g, 0[V] is applied to the mobile charge collector layer 24 through the second-conductivity-type well Wb2. Thereby, the voltage (0[V]) is applied through the mobile charge collector layer 24 to the mobile charge collecting contact CC1, the mobile charge collecting first wiring layer 32, the in-between contact 33, and the mobile charge collecting second wiring layer 35, which are electrically connected to the mobile charge collector layer 24.

When the voltage is applied, the mobile charge collector layer 24, the mobile charge collecting contact CC1, the mobile charge collecting first wiring layer 32, the in-between contact 33, and the mobile charge collecting second wiring layer 35 attract the mobile charges from the insulation layer 37. Correspondingly, the collection of the mobile charges near the floating gates 10a and 10b is reduced. Particularly in this embodiment, the mobile charge collecting contact CC1, the mobile charge collecting first wiring layer 32, and the in-between contact 33 extend (protrude) from the second-conductivity-type well Wb2, along with the floating gates 10a and 10b extending (protruding) from the second-conductivity-type well Wb2. Hence the mobile charges close to the first wiring layer are collected by the mobile charge collecting contact CC1, the mobile charge collecting first wiring layer 32, and the in-between contact 33.

In this embodiment, the mobile charge collecting second wiring layer 35 is disposed at the position of (or the position corresponding to the position of) the second wiring layer 200. Hence the mobile charges that are close to the second wiring layer 200 in the insulation layer 37 are collected by the mobile charge collecting second wiring layer 35 before the mobile charges reach the floating gates 10a and 10b. Correspondingly, the collection of the mobile charges near the floating gates 10a and 10b is reduced.

Each of the mobile charge collecting contacts CC2, CC3, and CC4 disposed in the respective mobile charge collector layers 25, 26, and 27 comprises the mobile charge collecting first wiring layer 32, the in-between contact 33, and the mobile charge collecting second wiring layer 35, which function as the mobile charge collectors to reduce the collection of the mobile charges near the floating gates 10a and 10b.

The mobile charges in the insulation layer 37 above each of the mobile charge collector layers 25, 26, and 27 are collected by the mobile charge collecting first wiring layer 32, the in-between contact 33, and the mobile charge collecting second wiring layer 35. Correspondingly, the collection of the mobile charges near the floating gates 10a and 10b is reduced.

In the above-described configuration, the non-volatile semiconductor memory device 1 comprises the floating gates 10a and 10b, which are surrounded by the insulation layer 37 and electrically isolated from each other. Each of the memory cells 2a, 2b, 2c, 2d, 2e, 2f, 2g, 2h, 2i, 2j, 2k, and 2l comprises the floating gate 10a or 10b. The memory cells 2a, 2b, 2c, 2d, 2e, 2f, 2g, 2h, 2i, 2j, 2k, and 2l have the same configuration. For example, in this embodiment, the memory cell 2a comprises the control capacitor 4 configured to adjust the potential of the floating gate 10b, the charge injection transistor 5 configured to inject charges into the floating gate 10b, the charge removal transistor 8 configured to remove charges from the floating gate 10b, and the readout transistor 7 configured to read out a voltage corresponding to the presence or absence of charges in the floating gate 10b. The control capacitor 4, the charge injection transistor 5, the charge removal transistor 8, and the readout transistor 7 share the floating gate 10b.

In the non-volatile semiconductor memory device 1, the mobile charge collector layers 24, 25, and 26, the mobile charge collecting contacts CC1, CC2, and CC3, the mobile charge collecting first wiring layers 32, the in-between contacts 33, and the mobile charge collecting second wiring layers 35 are disposed in the between-column regions ER1, ER2, and ER3 between the floating gates 10a and 10b that are next to each other in the row direction. The mobile charge collector layers 24, 25, and 26, the mobile charge collecting contacts CC1, CC2, and CC3, the mobile charge collecting first wiring layers 32, the in-between contacts 33, and the mobile charge collecting second wiring layers attract the mobile charges from the insulation layer 37 and thereby reduce the collection of the mobile charges near the floating gates 10a and 10b.

In addition, in the non-volatile semiconductor memory device 1, the mobile charge collector layer 27, the mobile charge collecting contacts CC4, the mobile charge collecting first wiring layers 32, the in-between contacts 33, and the mobile charge collecting second wiring layer 35, are disposed in the between-row region ER4 between the floating gates 10a and 10a (or 10b and 10b) that are next to each other in the column direction. The mobile charge collector layer 27, the mobile charge collecting contacts CC4, the mobile charge collecting first wiring layers 32, the in-between contacts 33, and the mobile charge collecting second wiring layer 35 attract the mobile charges from the insulation layer 37 and thereby reduce the collection of the mobile charges near the floating gates 10a (or 10b).

In the non-volatile semiconductor memory device 1, the mobile charge collector layers 24, 25, 26, and 27, the mobile charge collecting contacts CC1, CC2, CC3, and CC4, the mobile charge collecting first wiring layers 32, the in-between contacts 33, and the mobile charge collecting second wiring layers 35, each of which functions as the mobile charge collector, collects the mobile charges from the insulation layer 37. Correspondingly, the collection of the mobile charges near the floating gates 10a and 10b is reduced and thereby fluctuations in threshold voltages of the memory cells 2a, 2b, 2c, 2d, 2e, 2f, 2g, 2h, 2i, 2j, 2k, and 2l resulting from the collection of the mobile charges near the floating gates 10a and 10b are reduced.

In the non-volatile semiconductor memory device 1, each of the areas of the first active region 15, the second active region 16, the third active region 18, and the fourth active region 21 (hereinafter simply referred to as active regions)

is not increased. Hence the junction capacity between the second active region 16 and the second-conductivity-type well Wb1 and the junction capacity between the fourth active region 21 and the first-conductivity-type well Wa2 are not increased. Therefore the memory cells 2a, 2b, 2c, 2d, 2e, 2f, 2g, 2h, 2i, 2j, 2k, and 2l achieve high-speed performance, similar to that of the conventional memory cells.

According to the above-described configuration, the non-volatile semiconductor memory device 1 reduces the number of mobile charges attracted to the floating gates 10a and 10b, without increasing the areas of the active regions. Thus, the non-volatile semiconductor memory device 1 achieves the high-speed performance of the memory cells 2a, 2b, 2c, 2d, 2e, 2f, 2g, 2h, 2i, 2j, 2k, and 2l, similar to that of the conventional memory cells, while reducing the fluctuations in the threshold voltages of the memory cells 2a, 2b, 2c, 2d, 2e, 2f, 2g, 2h, 2i, 2j, 2k, and 2l caused by the collection of the mobile charges, which are attracted from the insulation layer 37, near the floating gates 10a and 10b.

The present invention is not limited to the present embodiment and various changes may be possible within the scope of the present invention. For example, the above-described embodiment describes the non-volatile semiconductor memory device 1 comprising the mobile charge collectors such as the mobile charge collector layers 24, 25, 26, and 27, the mobile charge collecting contacts CC1, CC2, CC3, CC4, the mobile charge collecting first wiring layers 32, the in-between contacts 33, and the mobile charge collecting second wiring layers 35. The present invention is not limited to this. A non-volatile semiconductor memory device may comprise a part of the mobile charge collector layers 24, 25, 26, and 27, the mobile charge collecting contacts CC1, CC2, CC3, and CC4, the mobile charge collecting first wiring layers 32, the in-between contacts 33, and the mobile charge collecting second wiring layers 35, as the mobile charge collectors. For example, a non-volatile semiconductor memory device may comprise only the mobile charge collector layers 24, 25, 26, and 27, the mobile charge collecting contacts CC1, CC2, CC3, and CC4, and the mobile charge collecting first wiring layers 32, without the mobile charge collecting second wiring layers 35. A non-volatile semiconductor memory device may comprise only the mobile charge collector layers 24, 25, 26, and 27.

Figure 3:
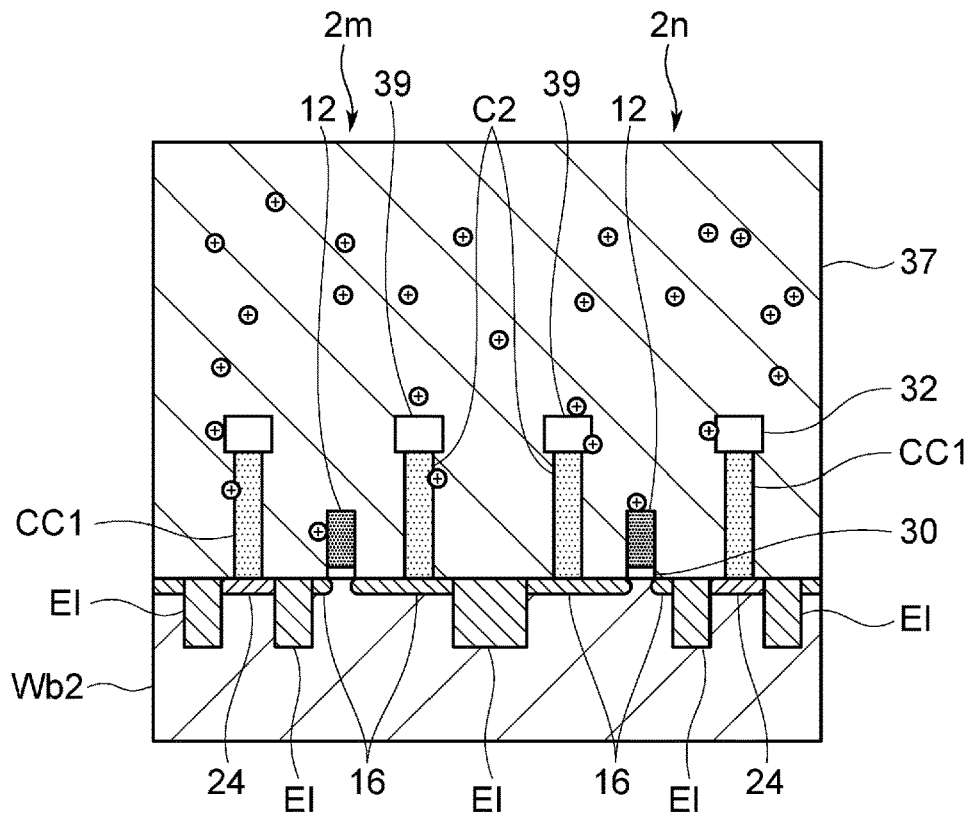
FIG. 3 is a cross-sectional view of a configuration in which only mobile charge collector layers, mobile charge collecting contacts, and mobile charge collecting first wiring layers are provided.

Of the memory cells disposed in a matrix of rows and columns shown in FIG. 1, FIG. 3, in which parts corresponding to those in FIG. 2 are denoted by the same reference numerals, shows a cross-section of a region including the mobile charge collector layers 24 in the memory cells 2m and 2n, which are next to each other in the row direction. In this configuration, the mobile charge collector layer 24 is provided only with the mobile charge collecting contact CC1 and the mobile charge collecting first wiring layer 32, without the in-between contact 33 and the mobile charge collecting second wiring layer 35 (see FIG. 2).

In this case, with the use of the mobile charge collector layer 24, the mobile charge collecting contact CC1, and the mobile charge collecting first wiring layer 32, the non-volatile semiconductor memory device collects the mobile charges from the insulation layer 37. Correspondingly, the collection of the mobile charges near the floating gates 10a and 10b is reduced and the resulting fluctuations in the threshold voltages of the memory cells 2m and 2n are reduced.

In the non-volatile semiconductor memory device, each of the areas of the second active region 16, the first active region 15, the third active region 18, and the fourth active region 21 (the active regions 15, 18, and 2l are not shown in FIG. 3) is not increased. Hence the junction capacity and the like between, for example, the second active region 16 and the second-conductivity-type well Wb1 are not increased. Correspondingly, the memory cells 2m and 2n achieve high-speed performance, similar to that of the conventional memory cells.

Figure 4:
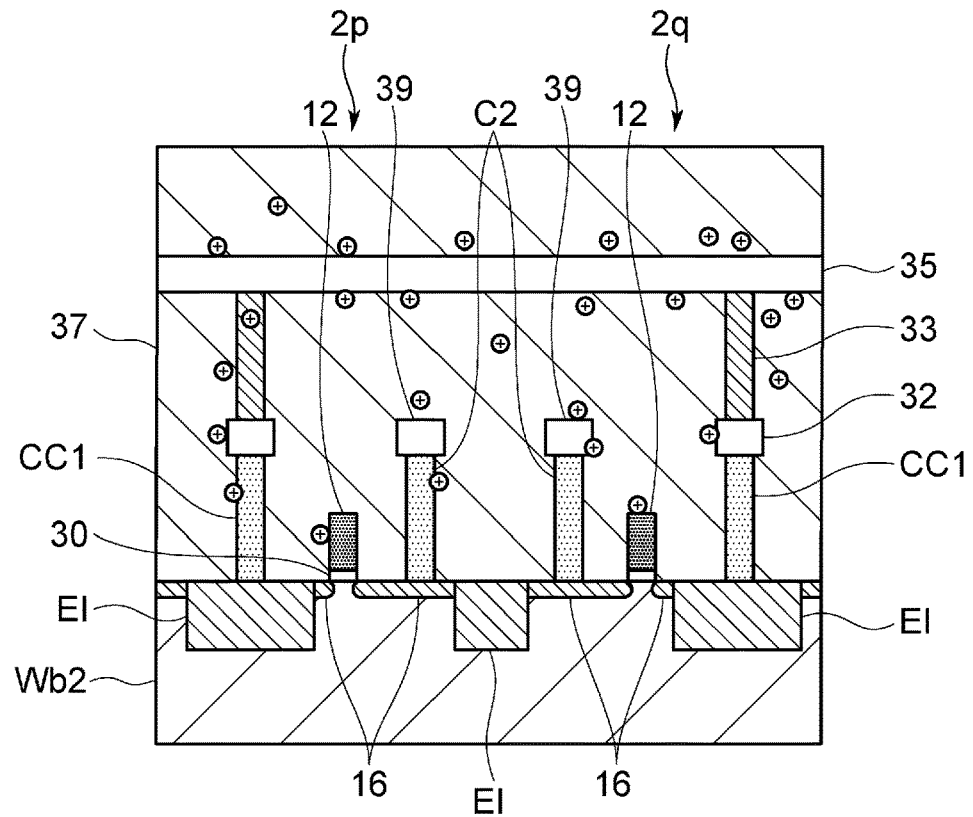
FIG. 4 is a cross-sectional view of a configuration in which only the mobile charge collecting contacts, the mobile charge collecting first wiring layers, in-between contacts disposed between the mobile charge collector layers, and a mobile charge collecting second wiring layer are provided.

In another embodiment, for example, a non-volatile semiconductor memory device may be provided only with the mobile charge collecting contacts CC1, CC2, CC3, and CC4, the mobile charge collecting first wiring layers 32, the in-between contacts 33, and the mobile charge collecting second wiring layers 35, without the mobile charge collector layers 24, 25, 26, and 27, which are embedded in the surface of the well. Of the memory cells arranged in the matrix of rows and columns in FIG. 1, FIG. 4, in which parts corresponding to those in FIG. 2 are denoted by the same reference numerals, shows a cross-section of the second active regions 16 in the memory cells 2p and 2q, which are next to each other in the row direction. FIG. 4 shows a configuration in which only the mobile charge collecting contacts CC1, the mobile charge collecting first wiring layers 32, the in-between contacts 33, and the mobile charge collecting second wiring layer 35 are provided.

In this embodiment, the mobile charge collecting contact CC1 is disposed in a standing manner on the surface of the second-conductivity-type well Wb2, for example. The in-between contact 33 and the mobile charge collecting second wiring layer 35 are disposed on top of the mobile charge collecting contact CC1 through the mobile charge collecting first wiring layer 32. In the embodiments described in FIGS. 2 and 3, a voltage is applied from the mobile charge collector layer 24 to the mobile charge collecting contact CC1, the mobile charge collecting first wiring layer 32, the in-between contact 33, and the mobile charge collecting second wiring layer 35 and thereby the mobile charges are collected from the insulation layer 37.

On the other hand, the mobile charge collector layer 24 is not provided in the configuration shown in FIG. 4. Hence a voltage is directly applied to the mobile charge collecting contact CC1, the mobile charge collecting first wiring layer 32, the in-between contact 33, and the mobile charge collecting second wiring layer 35, so that the voltage on the mobile charge collecting contact CC1, the mobile charge collecting first wiring layer 32, the in-between contact 33, and the mobile charge collecting second wiring layer 35 are adjusted. Thus, the mobile charges are collected from the insulation layer 37.

In the above-described non-volatile semiconductor memory device, the mobile charge collecting contact CC1, the mobile charge collecting first wiring layer 32, the in-between contact 33, and the mobile charge collecting second wiring layer 35 collect the mobile charges from the insulation layer 37. Correspondingly, the collection of the mobile charges near the floating gates 10a and 10b is reduced and the resulting fluctuations in the threshold voltages of the memory cells 2p and 2q are reduced.

In the non-volatile semiconductor memory device, each of the areas of the second active region 16, the first active region 15, the third active region 18, and the fourth active region 21 (the active regions 15, 18, and 2l are not shown) is not increased. Hence the junction capacity and the like between, for example, the second active region 16 and the second-conductivity-type well Wb1 are not increased. Correspondingly, the memory cells 2p and 2q achieve high-speed performance, similar to that of the conventional memory cells.

Figure 5:
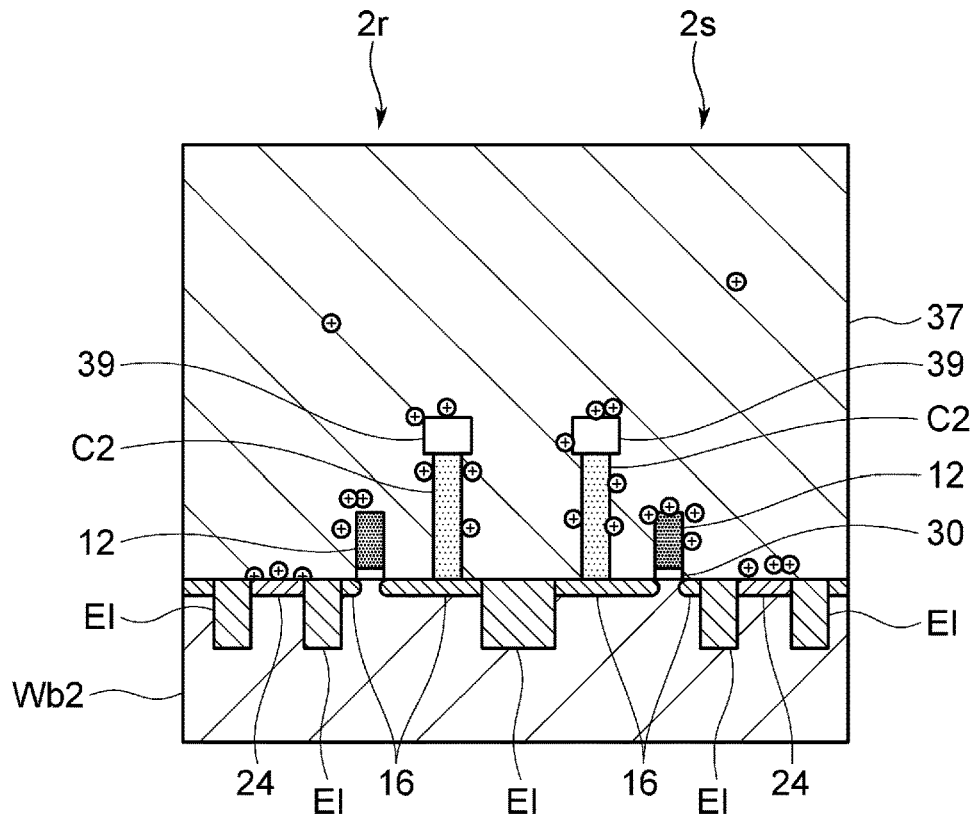
FIG. 5 is a cross-sectional view of a configuration in which only the mobile charge collector layers are provided.

FIG. 5, in which parts corresponding to those in FIG. 2 are denoted by the same reference numerals, shows a cross-section of the second active regions 16 in the memory cells 2r and 2s next to each other in the row direction and comprising only the mobile charge collector layers 24, without the mobile charge collecting contacts CC1, the mobile charge collecting first wiring layers 32, the in-between contacts 33, and the mobile charge collecting second wiring layer 35, for example. In this embodiment, only the mobile charge collector layer 24 is disposed adjacent to the second active region 16. The mobile charge collector layer 24 collects the mobile charges from the insulation layer 37.

In the above-described non-volatile semiconductor memory device, the mobile charge collector layer 24 collects the mobile charges from the insulation layer 37. Correspondingly, the collection of the mobile charges near the floating gates 10a and 10b is reduced and the resulting fluctuations in the threshold voltages of the memory cells 2r and 2s are reduced.

In the above-described non-volatile semiconductor memory device, each of the areas of the second active region 16, the first active region 15, the third active region 18, and the fourth active region 21 (the active regions 15, 18, and 21 are not shown) is not increased. Hence the junction capacity and the like between, for example, the second active region 16 and the second-conductivity-type well Wb1 are not increased. Correspondingly, the memory cells 2r and 2s achieve high-speed performance, similar to that of the conventional memory cells.

Figure 6:
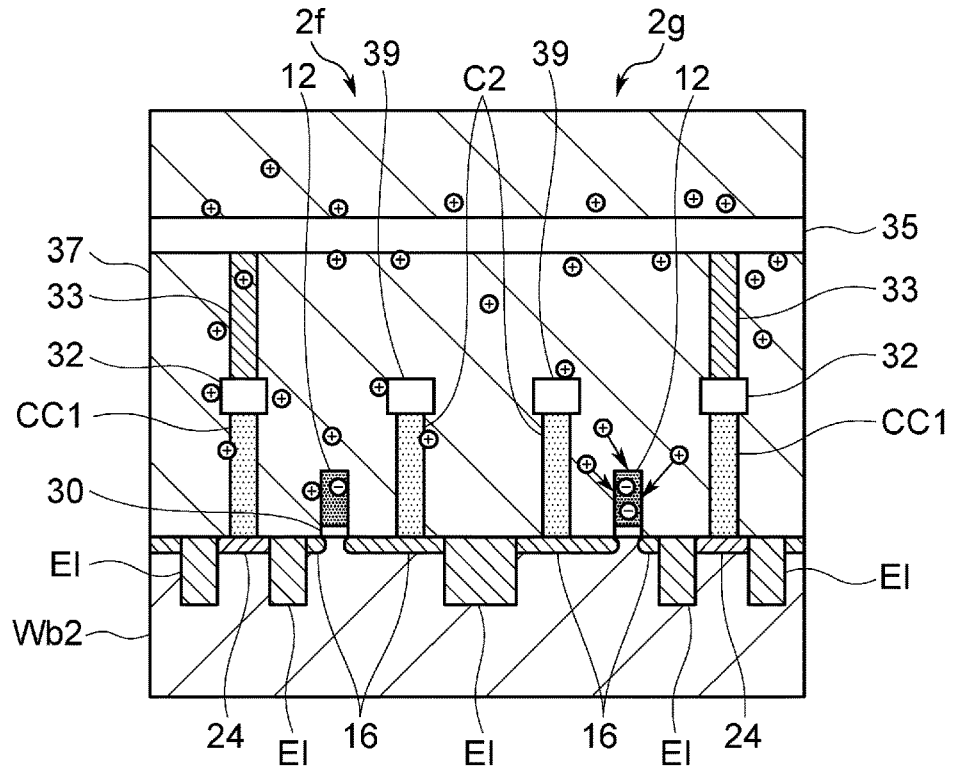
FIG. 6 is a schematic view illustrating how positive mobile charges close to a floating gate are attracted to the floating gate.

As illustrated in FIG. 6, in which parts corresponding to those in FIG. 2 are denoted by the same reference numerals, in a case where charges (in this case, electrons) are injected into the floating gate 10a or 10b, so that data is written (programmed), for example, into the memory cell 2f or 2g in the non-volatile semiconductor memory device 1 shown in FIG. 1, the potential of the floating gate 10a or 10b reaches, for example, −1[V] when the charges are stored in the floating gate 10a or 10b. Thus the floating gate 10a or 10b in which the charge has been injected may have a negative potential relative to the potential (0[V]) of the mobile charge collector layer 24, the mobile charge collecting contact CC1, the mobile charge collecting first wiring layer 32, the in-between contact 33, and the mobile charge collecting second wiring layer 35.

There may be a possibility that the positive mobile charges (in the insulation layer 37) that are close to the floating gate 10a or 10b and not collected by the mobile charge collector layer 24, the mobile charge collecting contact CC1, the mobile charge collecting first wiring layer 32, the in-between contact 33, or the mobile charge collecting second wiring layer 35 may be attracted to the floating gate 10a or 10b. The positive mobile charges attracted to the floating gate 10a or 10b may cause the fluctuations in the threshold voltage of the charge injection transistor 5, for example.

Figure 7:
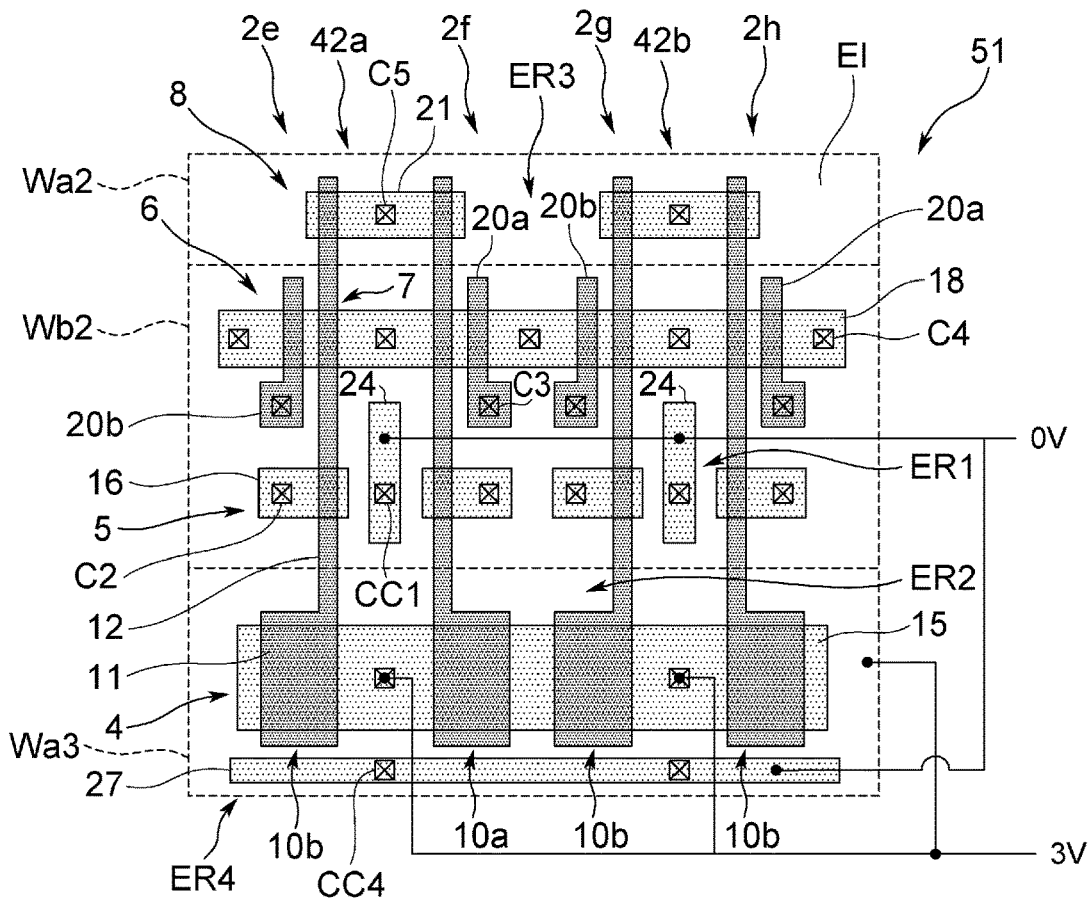
FIG. 7 is a schematic view illustrating a state in which an adjustment voltage is applied to a control capacitor.

In order to avoid such fluctuations, in a non-volatile semiconductor memory device 51 in FIG. 7, an adjustment voltage of 3[V], for example, is applied to the first active region 15 and the first-conductivity-type well Wa3, so that the adjustment voltage of 3[V] is applied to each of the control capacitors 4 of the memory cells 2e, 2f, 2g, and 2h, which is formed in the first active region 15 and the first-conductivity-type well Wa3. Thereby, in the memory cells 2e, 2f, 2g, and 2h, the potential of the floating gate 10a or 10b, which is supposed to reach the potential of −1[V] due to the storage of the charges, is adjusted (raised) to approximately 2[V]. Thus, in the non-volatile semiconductor memory device 51, the floating gate 10a or 10b is biased to a positive potential relative to the potential of the mobile charge collector layer 24, the mobile charge collecting contact CC1, the mobile charge collecting first wiring layer 32, the in-between contact 33, and the mobile charge collecting second wiring layer 35.

Figure 8:
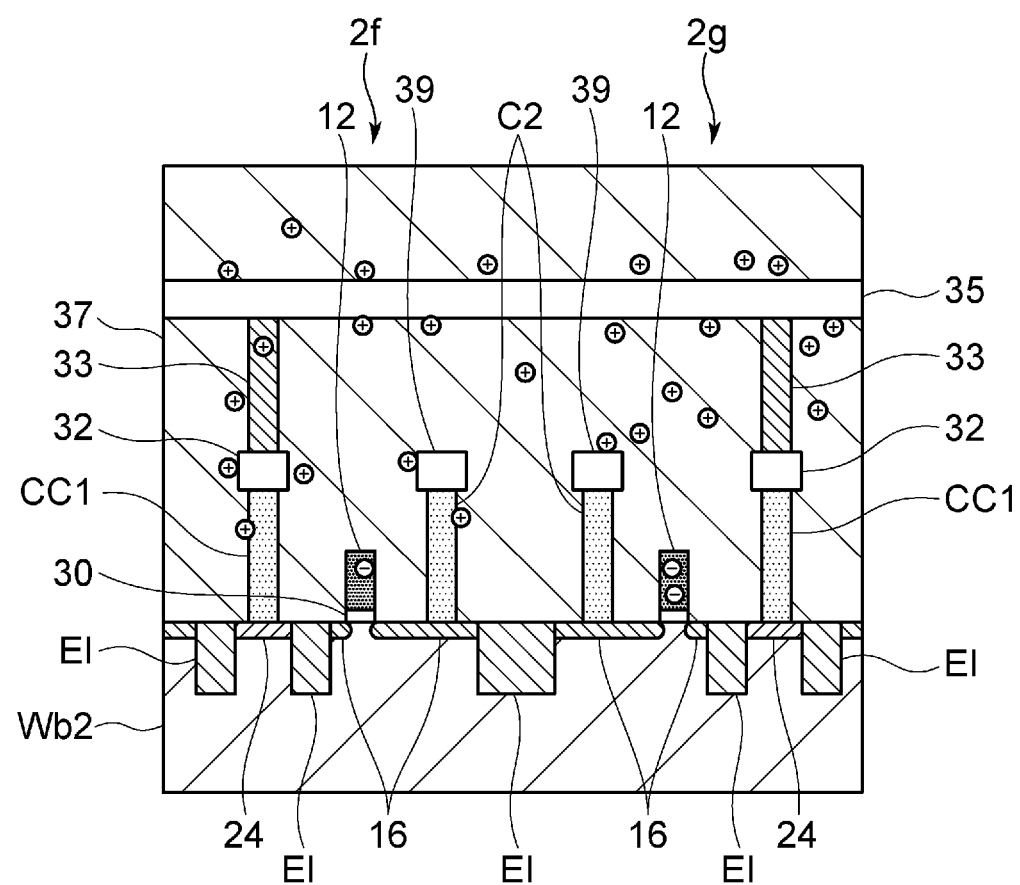
FIG. 8 is a schematic view illustrating a state of the positive mobile charges when the adjustment voltage is applied to the control capacitor.

As illustrated in FIG. 8, even if the positive mobile charges are present close to the floating gate 10a or 10b, the mobile charges are attracted to the mobile charge collector layer 24, the mobile charge collecting contact CC1, the mobile charge collecting first wiring layer 32, the in-between contact 33, and the mobile charge collecting second wiring layer 35, without being attracted to the floating gates 10a or 10b. Thus, the fluctuations in the threshold voltages of the memory cells 2f and 2g resulting from the collection of the mobile charges, which are attracted from the insulation layer 37, near the floating gates 10a and 10b is reduced.

In FIG. 7, the non-volatile semiconductor memory device 51 comprises only the mobile charge collector layers 24, out of the mobile charge collector layers 24, 25, 26, and 27 shown in FIG. 1. Alternatively or in addition, the non-volatile semiconductor memory device 51 may comprise the mobile charge collector layers 25, 26, and/or 27. Similar to the above embodiments, the non-volatile semiconductor memory device 51 further comprises the mobile charge collecting contact CC1 (CC2, CC3, and/or CC4), the mobile charge collecting first wiring layer 32, the in-between contact 33, and the mobile charge collecting second wiring layer 35. However, the descriptions thereof are omitted to avoid repetition.

As described above, the voltage(s) is applied to the mobile charge collecting contacts CC1, CC2, CC3, and CC4, the mobile charge collecting first wiring layers 32, the in-between contacts 33, and the mobile charge collecting second wiring layers 35, to collect the mobile charges from the insulation layer 37. The voltage may be applied from an active region, such as the first active region 15, or a well. The voltage may be applied to the mobile charge collecting first wiring layer 32 and/or the mobile charge collecting second wiring layer 35, for example.

In the above embodiments, the non-volatile semiconductor memory device 1 is described in which the mobile charge collector layers 24, 25, and 26 and the mobile charge collecting contacts CC1, CC2, and CC3 are disposed in the between-column regions ER1, ER2, and ER3 disposed between the floating gates 10a and 10b that are next to each other in the row direction. The mobile charge collector layer 27 and the mobile charge collecting contact CC4 are disposed in the between-row region ER4 between the floating gates 10a and 10a (or 10b and 10b) next to each other in the column direction. The present invention is not limited to this. A non-volatile semiconductor memory device may comprise the mobile charge collector layers 24, 25, and 26 and the mobile charge collecting contacts CC1, CC2, and CC3 only in the between-column regions ER1, ER2, and ER3 disposed between the floating gates 10a and 10b next to each other in the row direction. A non-volatile semiconductor memory device may comprise the mobile charge collector layer 27 and the mobile charge collecting contact CC4 only in the between-row region ER4 disposed between the floating gates 10a and 10b next to each other in the column direction. A non-volatile semiconductor memory device may comprise a mobile charge collector layer and/or a mobile charge collecting contact in one of the between-column regions ER1, ER2, and ER3.

In the above embodiments, an example is described in which the movable charge collector is disposed at an equal distance from each of the two floating gates that are next to each other. However, an alignment error of the movable charge collector is inevitable since a lithography process for processing the floating gates and a lithography process for processing an active region, being the movable charge collector (the mobile charge collector layers 24, 25, 26, or 27), are different processes. Actually, even if the mobile charge collector is disposed at an equal distance from each of the floating gates in a layout pattern, a distance between one of the floating gates and the mobile charge collector may become different between a distance from the other of the floating gates and the mobile charge collector due to the alignment error. In manufacturing, it is preferred that the mobile charge collector is disposed at an equal distance from each of the two floating gates, taking account of the alignment error.

In the above embodiments, the non-volatile semiconductor memory device 1 is described, in which charges are injected into the floating gate 10a or 10b at the time of writing data and the stored charges are removed from the floating gate 10a or 10b at the time or erasing data. The present invention is not limited to this. A non-volatile semiconductor memory device 1 may remove the stored charges from the floating gate 10a or 10b at the time of writing data and inject charges into the floating gate 10a or 10b at the time of erasing data.

In the above embodiments, the switch transistor 6 is connected in series with the readout transistor 7 by way of example. The present invention is not limited to this. Only the readout transistor 7 may be provided without the switch transistor 6.

In the above embodiments, the non-volatile semiconductor memory device 1 is described in which charges are injected into the floating gate 10a or 10b at the time of writing data and charges are removed from the floating gate 10a or 10b at the time or erasing data. The present invention is not limited to this. A non-volatile semiconductor memory device 1 may remove charges from the floating gate 10a or 10b at the time of writing data and inject charges into the floating gate 10a or 10b at the time of erasing data.

In the above embodiments, the memory cells 2a, 2b, 2c, 2d, 2e, 2f, 2g, 2h, 2i, 2j, 2k, and 2l are described, each of which comprises the control capacitor 4 configured to adjust the potential of the floating gate 10a or 10b, the charge injection transistor 5 configured to inject charges into the floating gate 10a or 10b, the charge removal transistor 8 configured to remove charges from the floating gate 10a or 10b, the readout transistor 7 for reading out a voltage corresponding to the presence or absence of charges in the floating gate 10a or 10b. The control capacitor 4, the charge injection transistor 5, the charge removal transistor 8, and the readout transistor 7 in each memory cell share the floating gate 10a or 10b. The present invention is not limited to this. The memory cell may comprise at least the floating gate 10a or 10b. Various memory cells, for example, a memory cell that does not comprise the charge injection transistor 5 or a memory cell that does not comprise the charge removal transistor 8 may be used.

In the above embodiments, examples are described in which one memory cell comprises three types of wells, for example, the first-conductivity-type well Wa1, the second-conductivity-type well Wb1, the first-conductivity-type well Wa2. The present invention is not limited to this. The structure of a well, which is disposed on a substrate, may be changed as appropriate. For example, one memory cell may be composed of two types of wells, without the use of the charge removal transistor 8 and the first-conductivity-type well Wa2.

REFERENCE SIGNS LIST 1, 51 non-volatile semiconductor memory device
2a, 2b, 2c, 2d, 2e, 2f, 2g, 2h, 2i, 2j, 2k, 2l memory cell
4 control capacitor
5 charge injection transistor
6 switch transistor
7 readout transistor
8 charge removal transistor
10a, 10b floating gate
24, 25, 26, 27 movable charge collector layer (movable charge collector)
CC1, CC2, CC3, CC4 movable charge collecting contact (movable charge collector)
32 movable charge collecting first wiring layer (movable charge collector)
33 in-between contact between mobile charge collector layers (mobile charge collector)
35 movable charge collecting second wiring layer (movable charge collector)
Wa1, Wa2, Wa3 the first-conductivity-type well (well)
Wb1, Wb2 the second-conductivity-type well (well)
EI element isolation layer

The invention claimed is:

1. Non-volatile semiconductor memory device comprising:
    first, second, and third wells, the second well being arranged between the first and third wells, and the first and third wells sharing a conductivity type that is different from a conductivity type of the second well;
    a first active region in the first well;
    second and third active regions in the second well;
    a fourth active region in the third well;
    a plurality of memory cells arranged in a matrix, a column direction of the matrix being parallel to an arrangement direction of the first, second, and third wells, each of the plurality of memory cells comprising:
    a control capacitor in the first active region,
    a charge injection transistor in the second active region,
    a readout transistor in the third active region,
    a charge removal transistor in the fourth active region, and
    a floating gate shared by the control capacitor, the charge injection transistor, the readout transistor, and the charge removal transistor, the floating gate extending across the first, second, third, and fourth active regions;
    an insulation layer in which mobile charges are present, the insulation layer surrounding the floating gate; and
    a mobile charge collector layer disposed between two neighboring floating gates of respective two neighboring memory cells of the plurality of memory cells and embedded in a surface of each of the first, second, and third wells such that the mobile charge collector layer is separated from the first, second, third, and fourth active regions, the two neighboring floating gates being next to each other in a row direction or column direction of the matrix, the mobile charge collector layer being configured to attract the mobile charges in the insulation layer so as to keep the mobile charges away from the floating gate of each of the plurality of memory cells.

2. The non-volatile semiconductor memory device according to claim 1, wherein the mobile charge collector layer is disposed at an equal distance from the two neighboring floating gates.

3. The non-volatile semiconductor memory device according to claim 1, further comprising a mobile charge collecting contact disposed in a standing manner on a surface of the mobile charge collector layer.

4. The non-volatile semiconductor memory device according to claim 3, further comprising:
- a first wiring layer in which wiring for applying a voltage to each at least one of the plurality of memory cells is disposed, the first wiring layer being disposed above each of the first, second, and third wells; and
- a mobile charge collecting first wiring layer disposed at an end of the mobile charge collecting contact, the mobile charge collecting first wiring layer being disposed at a position corresponding to a height of the first wiring layer.

5. The non-volatile semiconductor memory device according to claim 4, wherein a mobile charge collecting in-between contact is disposed in a standing manner over the mobile charge collecting first wiring layer.

6. The non-volatile semiconductor memory device according to claim 5, further comprising:
- a second wiring layer in which wiring for applying a voltage to at least one of the plurality of memory cells is disposed, the second wiring layer being disposed above the first wiring layer; and
- a mobile charge collecting second wiring layer disposed at an end of the in-between contact, the mobile charge collecting second wiring layer being disposed at a position corresponding to a height of the second wiring layer.

7. The non-volatile semiconductor memory device according to claim 1, wherein, the mobile charges are attracted to the mobile charge collector layer to be kept away from the floating gate by applying a voltage to the floating gate with stored charges to adjust a voltage relationship between the floating gate and the mobile charge collector layer.

8. The non-volatile semiconductor memory device according to claim 1, wherein the mobile charge collector layer is a layer doped with impurities and disposed in the surface of each of the first, second, and third wells.

9. The non-volatile semiconductor memory device according to claim 8, wherein the second well or the first and third wells are a P-conductivity type and the impurities include boron (B) or indium (In).

10. The non-volatile semiconductor memory device according to claim 8, wherein the first and third wells or the second well is an N-conductivity type and the impurities include phosphorus (P), arsenic (As), or antimony (Sb).

* * * * *